(12) United States Patent
Takenaka et al.

(10) Patent No.: US 11,804,423 B2
(45) Date of Patent: Oct. 31, 2023

(54) SEMICONDUCTOR DEVICE

(71) Applicant: DENSO CORPORATION, Kariya (JP)

(72) Inventors: Masayuki Takenaka, Kariya (JP);
Yasushi Okura, Kariya (JP)

(73) Assignee: DENSO CORPORATION, Kariya (JP)

( * ) Notice: Subject to any disclaimer, the term of this patent is extended or adjusted under 35 U.S.C. 154(b) by 117 days.

(21) Appl. No.: 17/577,091

(22) Filed: Jan. 17, 2022

(65) Prior Publication Data
US 2022/0319962 A1    Oct. 6, 2022

(30) Foreign Application Priority Data

Mar. 31, 2021    (JP) .................................. 2021-059527

(51) Int. Cl.
*H01L 23/495* (2006.01)
*H01L 23/485* (2006.01)
*H01L 23/31* (2006.01)

(52) U.S. Cl.
CPC ...... *H01L 23/4952* (2013.01); *H01L 23/3142* (2013.01); *H01L 23/485* (2013.01); *H01L 23/49558* (2013.01); *H01L 23/49568* (2013.01)

(58) Field of Classification Search
CPC ....... H01L 23/49568; H01L 23/495558; H01L 23/3142; H01L 23/485; H01L 23/4952; H01L 25/11
See application file for complete search history.

(56) References Cited

U.S. PATENT DOCUMENTS 8,012,807 B2 *  9/2011  Meyer ................. H01L 23/3114
                                                    438/114
2019/0181125 A1 *  6/2019  Cho .................. H01L 23/49531

FOREIGN PATENT DOCUMENTS

JP        2016-086069 A       5/2016

* cited by examiner

*Primary Examiner* — Hoa B Trinh
(74) *Attorney, Agent, or Firm* — POSZ LAW GROUP, PLC

(57) ABSTRACT

A semiconductor device includes a semiconductor element, which has a protective film having an opening that exposes a part of a source electrode and disposed/provided to position an end portion thereof on the source electrode. A rewiring layer has wiring that is connected to the source electrode and to a conductive connecting member, and an insulator that covers a part of the source wiring. The insulator includes: an insulating film having (a) an opening for exposing a part of the source wiring, and (b) an end portion of the opening provided in a facing region of the opening; and an insulating film having (c) (i) an opening for exposing a part of the source wiring having a solder arranged therein and (ii) a connecting member arranged therein.

8 Claims, 9 Drawing Sheets

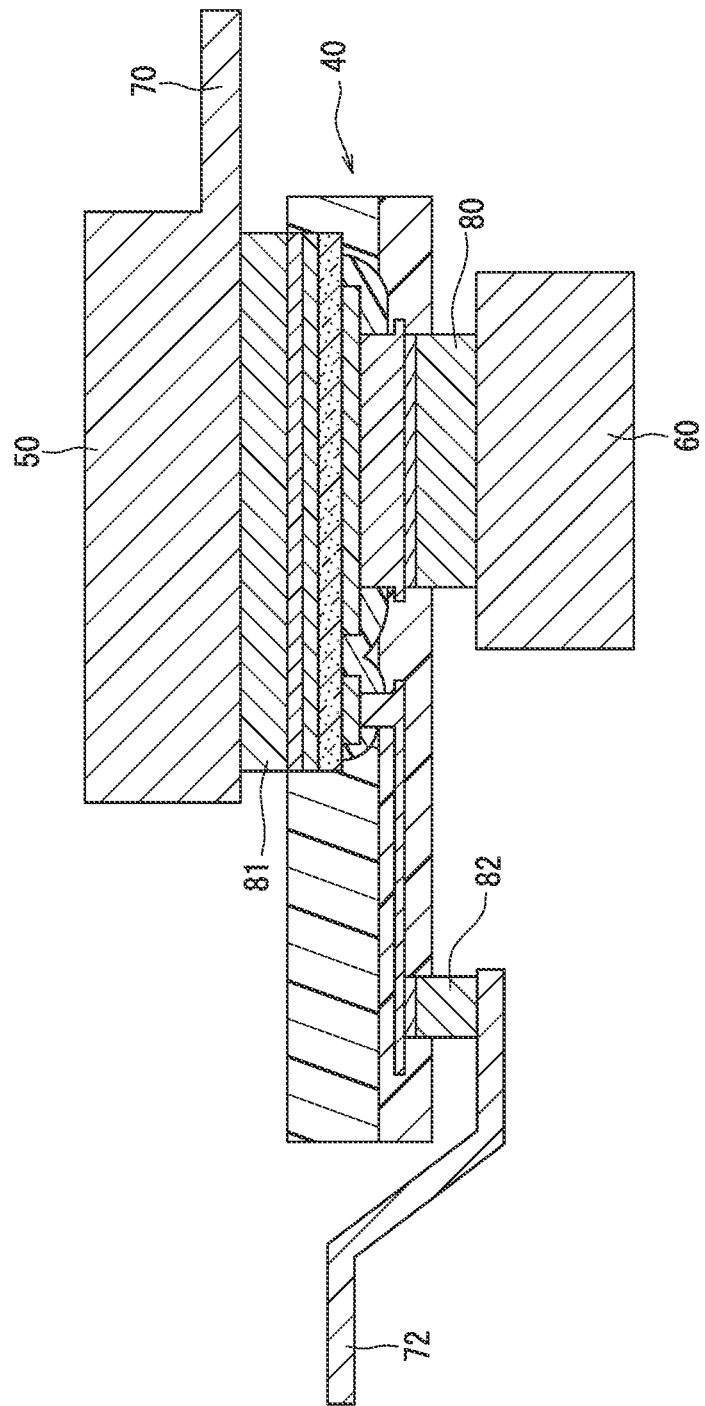

SEMICONDUCTOR DEVICE

CROSS REFERENCE TO RELATED APPLICATION

The present application is based on and claims the benefit of priority of Japanese Patent Application No. 2021-059527, filed on Mar. 31, 2021, the disclosure of which is incorporated herein by reference.

TECHNICAL FIELD

The present disclosure generally relates to a semiconductor device.

BACKGROUND

A comparative semiconductor device includes a semiconductor substrate, electrodes, a protective film, a front metal film, an antioxidant film, and a solder wetting prevention film. The protective film is formed so as to cover an end portion of the electrode. The antioxidant film is formed on the front metal film at an opening of the protective film. Then, the solder wetting prevention film covers a predetermined region of the opening of the protective film on a surface of the antioxidant film, extending from a portion located at an interface/boundary between the protective film and the antioxidant film. In the semiconductor device, the electrodes and a lead frame are connected via solder.

In the comparative semiconductor device, a size of an opening area of the solder wetting prevention film is smaller than a size of an opening area of the protective film. Therefore, the semiconductor device may have lower heat dissipation than a configuration in which the solder is connected without the solder wetting prevention film being provided.

SUMMARY

It is an object of the present disclosure to provide a semiconductor device capable of suppressing a decrease in heat dissipation. In other words, the semiconductor device is capable of increasing heat dissipation.

The disclosed aspects in the specification adopt different technical solutions from each other in order to achieve their respective objectives. The objects, features, and advantages disclosed in this specification will become apparent by referring to following detailed descriptions and accompanying drawings.

BRIEF DESCRIPTION OF THE DRAWINGS

Objects, features, and advantages of the present disclosure will become more apparent from the following detailed description made with reference to the accompanying drawings, in which:

FIG. 12 is a cross-sectional view showing a semiconductor device according to a third modification.

DETAILED DESCRIPTION

Figure 1:
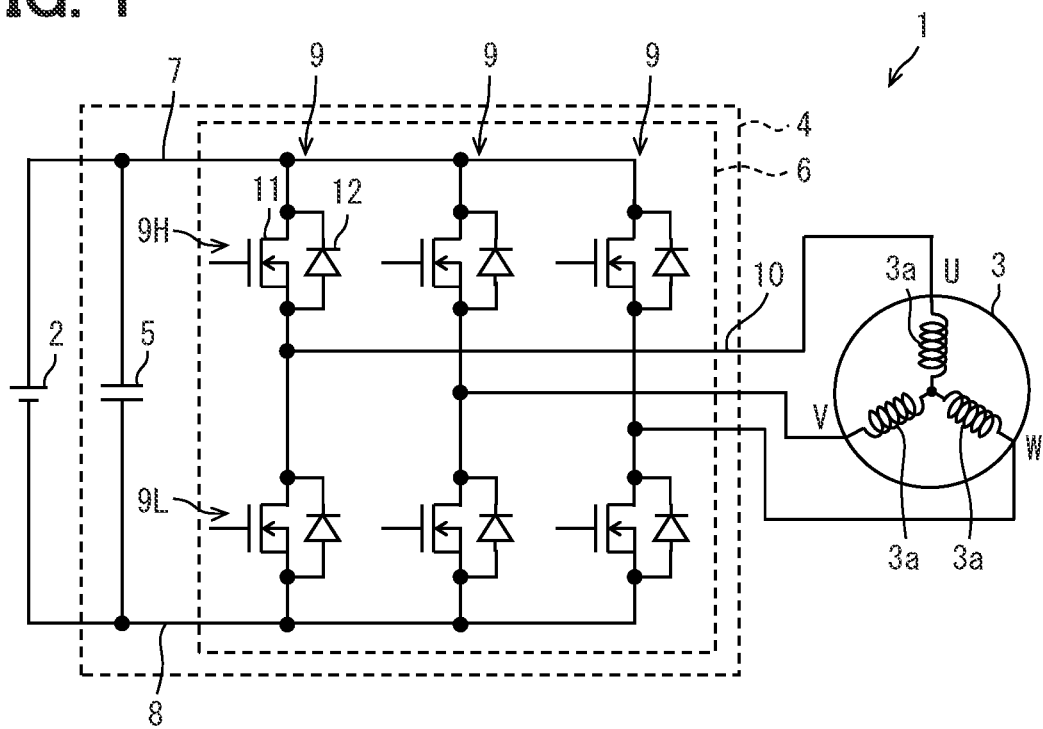
FIG. 1 is a diagram showing a circuit configuration of a power conversion device to which the semiconductor device according to the embodiments is applied.

As follows, multiple embodiments for implementing the present disclosure are described with reference to the drawings. In each of the embodiments, portions corresponding to those described in the preceding embodiment are denoted by the same reference numerals, and redundant descriptions are omitted in some cases. In each of the embodiments, when only a part of the configuration is described, the other part(s) of the configuration can be applied with reference to the other embodiments described above. Corresponding portions/parts are functionally and/or structurally corresponding portions/parts and/or associated portions/parts.

Figure 7:
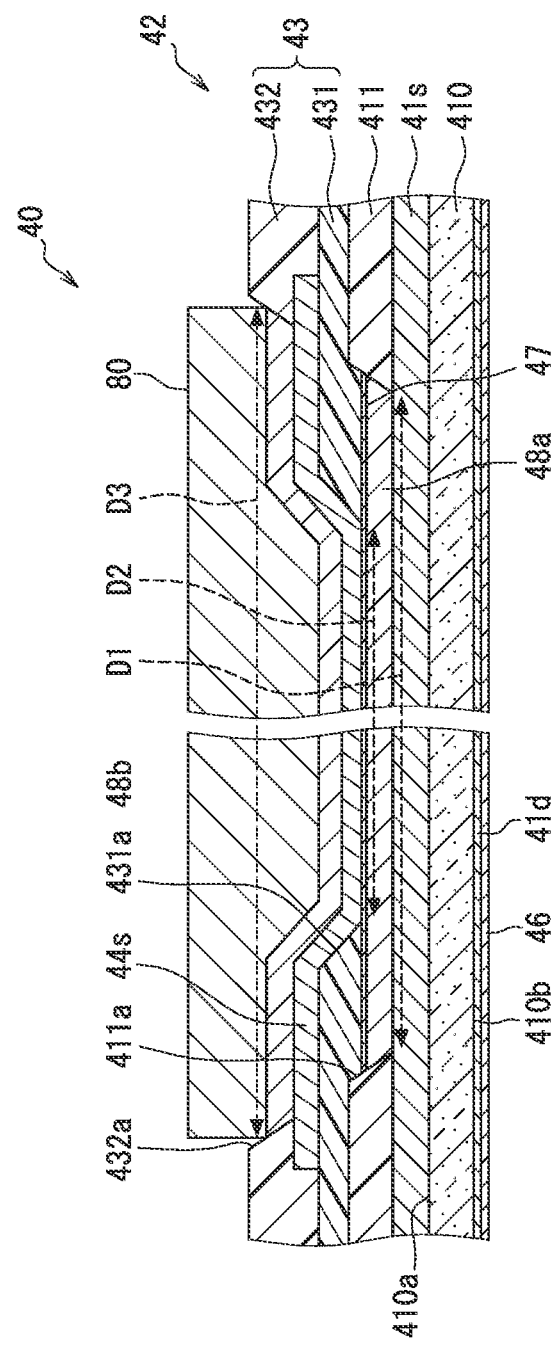
FIG. 7 is a cross-sectional view taken along a VII-VII line in FIG. 6.

In the following, the three directions orthogonal to each other are referred to as the X direction, the Y direction, and the Z direction. In addition, a plane defined by the X direction and the Y direction is denoted as an XY plane, a plane defined by the X direction and the Z direction is denoted as an XZ plane, and a plane defined by the Y direction and the Z direction is denoted as a YZ plane. For layered semi-conductor devices, it is common to intuitively describe a cross-sectional view in FIG. 3, as upwards or top (positive Z direction), downwards or bottom (negative Z direction), left (positive Y direction), and right (negative Y direction). Alternatively, the orientation of FIG. 7 is preferable because 9 layers are shown on "top" of the semiconductor substrate 410. In manufacturing, layers are generally created/deposited upwards on the substrate, one layer at a time.

The semiconductor device of the present embodiment is applicable to, for example, a power conversion device for a movable body driven by a rotating electric machine. The movable body is, for example, an electric vehicle such as an electric vehicle, a hybrid vehicle, a fuel cell vehicle, a vehicle such as a drone, a ship, a construction machine, or an agricultural machine. In the following, an example applied to an automotive vehicle is described.

EMBODIMENT

First, a schematic configuration of a vehicle drive system is described with reference to FIG. 1.

<Vehicle Drive System>

As shown in FIG. 1, a vehicle drive system 1 is provided with a DC power supply 2, a motor generator 3, and a power conversion device 4.

The DC power supply 2 is a direct-current voltage source including a chargeable/dischargeable secondary battery. The secondary battery is, for example, a lithium ion battery or a nickel hydride battery. The motor generator 3 is a three-phase AC type rotating electric machine. The motor generator 3 functions as a vehicle driving power source, that is, an electric motor. The motor generator 3 functions also as a generator during regeneration. The power conversion device 4 performs electric power conversion at a position between the DC power supply 2 and the motor generator 3.

<Power Converter>

Next, a circuit configuration of the power conversion device 4 is described with reference to FIG. 1. The power conversion device 4 includes a power conversion circuit. The power conversion device 4 of the present embodiment includes a smoothing capacitor 5 and an inverter 6 which is a power conversion circuit.

The smoothing capacitor 5 mainly smooths a DC voltage supplied from the DC power supply 2. The smoothing capacitor 5 is connected to a P line 7 which is a power line on a high potential side and an N line 8 which is a power line on a low potential side. The P line 7 is connected to a positive electrode of the DC power supply 2, and the N line 8 is connected to a negative electrode of the DC power supply 2. The positive electrode of the smoothing capacitor 5 is connected to the P line 7 at a position between the DC power supply 2 and the inverter 6. The negative electrode of the smoothing capacitor 5 is connected to the N line 8 at a position between the DC power supply 2 and the inverter 6. The smoothing capacitor 5 is connected in parallel with the DC power supply 2.

The inverter 6 is a DC-AC conversion circuit. The inverter 6 converts a DC voltage into a three-phase AC voltage, and outputs the AC voltage to the motor generator 3 according to switching control by a control circuit (not shown). Thereby, the motor generator 3 is driven to generate a predetermined torque. The inverter 6 converts the three-phase AC voltage generated by the motor generator 3 by receiving a rotational force from the wheels during a regenerative braking of the vehicle into the DC voltage according to the switching control by the control circuit, and outputs the DC voltage to the P line 7. In such manner, the inverter 6 performs bidirectional power conversion between the DC power supply 2 and the motor generator 3.

The inverter 6 includes upper-lower arm circuits 9 for three phases. The upper-lower arm circuit 9 may sometimes be referred to as a leg. The upper-lower arm circuits 9 have an upper arm 9H and a lower arm 9L, respectively. The upper arm 9H and the lower arm 9L are connected in series between the P line 7 and the N line 8, with the upper arm 9H put on a P line 7 side. A connection point between the upper arm 9H and the lower arm 9L is connected to a winding 3a of the corresponding phase in the motor generator 3 via an output line 10. The inverter 6 has six arms. Each arm is configured to include a switching element. At least a part of each of the P line 7, the N line 8, and the output line 10 is composed of a conductive member such as a bus bar.

In the present embodiment, an n-channel type MOSFET 11 is adopted as a switching element composing each arm. In the upper arm 9H, a drain of the MOSFET 11 is connected to the P line 7. In the lower arm 9L, a source of the MOSFET 11 is connected to the N line 8. A source of the MOSFET 11 in the upper arm 9H and a drain of the MOSFET 11 in the lower arm 9L are connected to each other.

Reflux diodes 12 are connected in antiparallel to each of the MOSFETs 11. The diode 12 may be a parasitic diode (i.e., body diode) of the MOSFET 11 or may be provided separately from the parasitic diode thereof. An anode of the diode 12 is connected to a source of the corresponding MOSFET 11, and a cathode is connected to the drain thereof. The term "antiparallel" here means in parallel with the MOSFET 11 and oriented to pass a reflux current when the MOSFET 11 is turned off.

The power conversion device 4 may further include a converter as a power conversion circuit. The converter is a DC-DC conversion circuit that converts a DC voltage into a DC voltage having a different value. The converter is provided at a position between the DC power supply 2 and the smoothing capacitor 5. The converter is configured to include, for example, a reactor and the above-mentioned upper-lower arm circuits 9. According to such a configuration, voltage boosting/suppression is made possible. The power conversion device 4 may include a filter capacitor that removes power supply noise from the DC power supply 2. The filter capacitor is provided at a position between the DC power supply 2 and the converter.

The power conversion device 4 may include a drive circuit for switching elements composing the inverter 6 and the like. The drive circuit supplies a drive voltage to a gate of the MOSFET 11 of the corresponding arm based on a drive instruction of the control circuit. The drive circuit drives, i.e., performs on-drive and off-drive of, a corresponding MOSFET 11 by applying a drive voltage. The drive circuit may sometimes be referred to as a driver.

The power conversion device 4 may include a control circuit for the switching element. The control circuit generates a drive instruction for operating an integrated gate bipolar transistor (IGBT) such as the MOSFET 11, and outputs the drive instruction to the drive circuit. The control circuit generates a drive instruction based on a torque request input from a higher-level ECU (not shown) and signals detected by various sensors.

Various sensors include, for example, a current sensor, a rotation angle sensor, and a voltage sensor. The current sensor detects a phase current flowing through the winding 3a of each phase. The rotation angle sensor detects a rotation angle of a rotor of the motor generator 3. The voltage sensor detects a voltage across the smoothing capacitor 5. The control circuit outputs, for example, a PWM signal as a drive instruction. The control circuit is configured to include, for example, a microcomputer/microcontroller. ECU is an abbreviation of Electronic Control Unit. PWM is an abbreviation of Pulse Width Modulation.

<Semiconductor Device>

Figure 2:
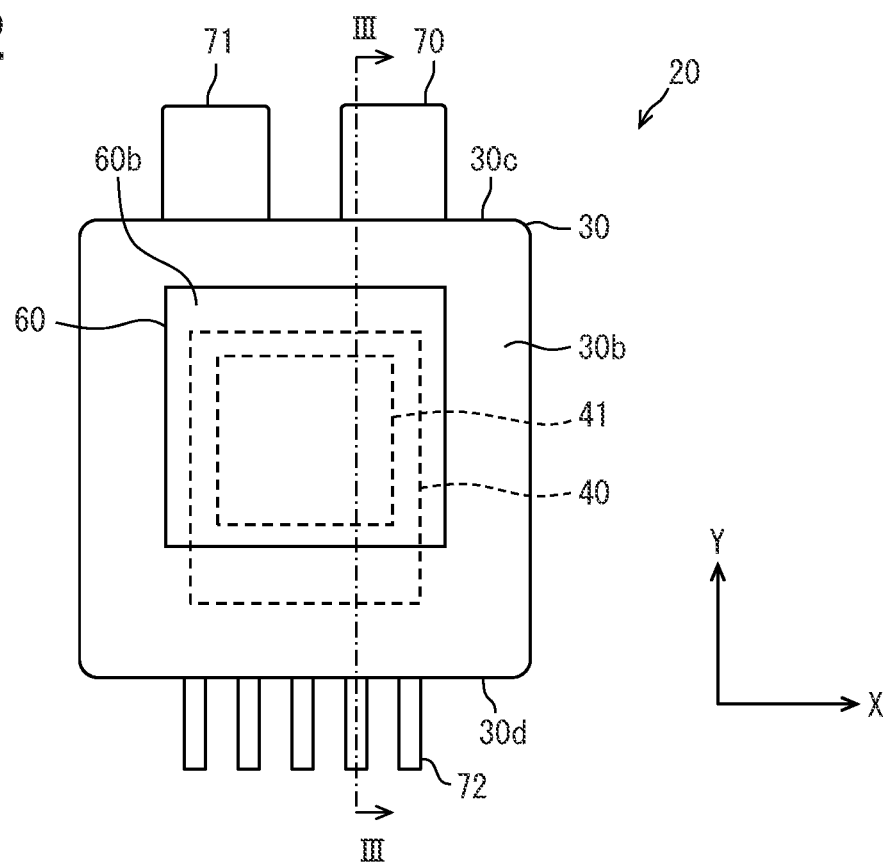
FIG. 2 is a plan view showing a semiconductor device according to a first embodiment.
Figure 3:
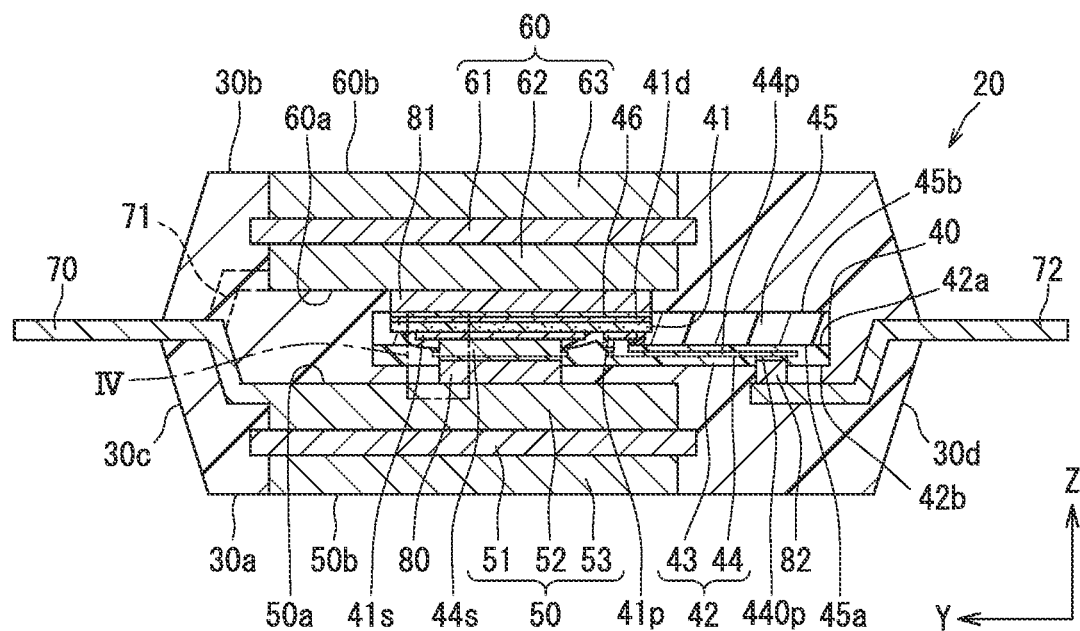
FIG. 3 is a cross-sectional view taken along a III-III line in FIG. 2.
Figure 4:
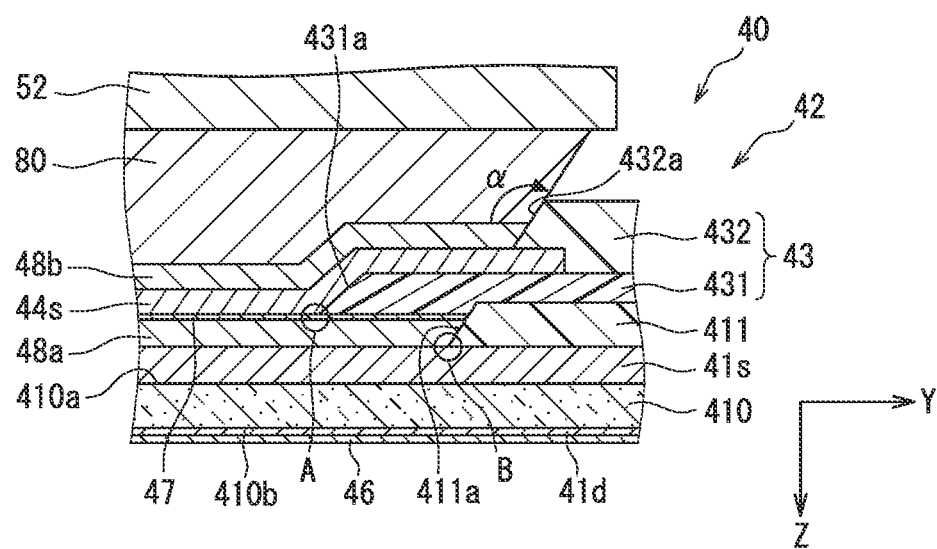
FIG. 4 is a partial cross-sectional view showing the semiconductor device.
Figure 5:
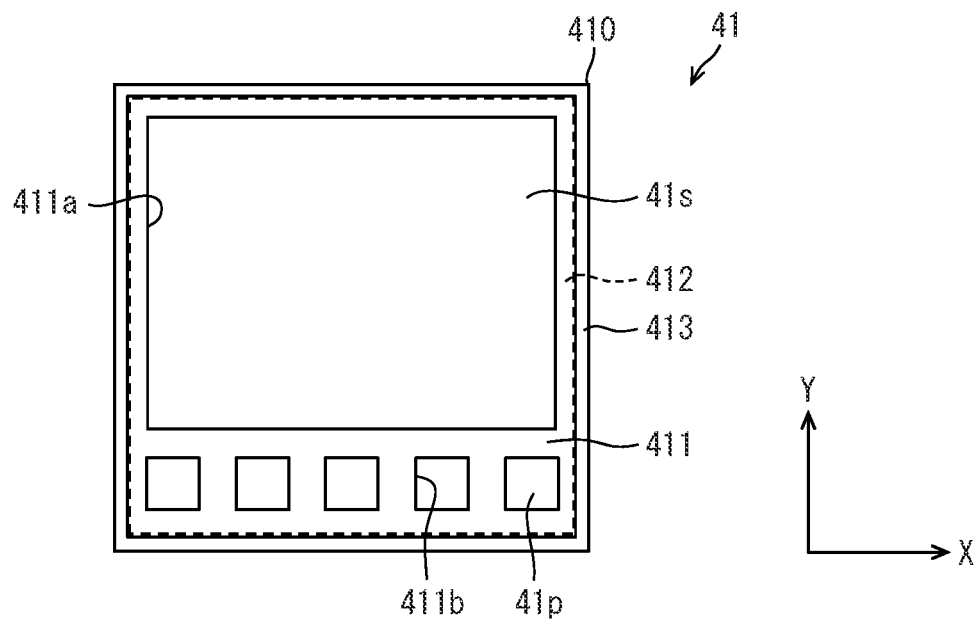
FIG. 5 is a plan view showing a semiconductor element.

Next, a schematic configuration of the entire semiconductor device is described with reference to FIGS. 2, 3, 4, and 5. FIG. 2 is a plan view showing the semiconductor device. FIG. 2 is a plan view of the semiconductor device seen from a top of the device. FIG. 3 is a cross-sectional view taken along a III-III line in FIG. 2. In FIG. 3, the structure of an element package is simplified and illustrated. FIG. 4 is an enlarged cross-sectional view of a connection portion of a solder 80. FIG. 5 is a plan view showing a schematic configuration of the semiconductor device included in the element package. In FIG. 5, an area surrounded by a broken line is an element area.

In the following, a thickness direction of the semiconductor element (i.e., semiconductor substrate) is defined as the Z direction. A direction orthogonal to the Z direction, which is an extending direction of an external connection terminal is the Y direction. A direction orthogonal to both of the Z direction and the Y direction is defined as the X direction. Unless otherwise specified, a shape in a plan view seen from the Z direction, in other words, a shape on the XY plane defined by the X and Y directions is denoted as a plane shape. The plan view from the Z direction may simply be referred to as a plan view.

A semiconductor device 20 shown in FIGS. 2 and 3 serves as one of the above-mentioned arms. That is, the two semiconductor devices 20 provide an upper-lower arm circuit 9 for one phase. The semiconductor device 20 includes a sealing resin body 30, an element package 40, heat radiating members 50 and 60, and main terminals 70 and 71 and signal terminals 72 which are external connection terminals.

The sealing resin body 30 seals a part of other elements composing the semiconductor device 20. The other parts of the other elements are exposed to an outside of the sealing resin body 30. The sealing resin body 30 is made of, for example, an epoxy resin. The sealing resin body 30 is formed by, for example, a transfer molding method. As shown in FIG. 2, the sealing resin body 30 has a substantially rectangular plane shape.

As shown in FIGS. 2 and 3, the sealing resin body 30 includes front surface 30b and a back surface 30b which is opposite to the front surface 30b. The sealing resin body 30 includes side surfaces 30c and 30d. The side surface 30d is a surface opposite to the side surface 30c in the Y direction.

The element package 40 is a package which packs/packages together (i) a switching element composing an arm and (ii) wiring connecting the switching element and other elements of the semiconductor device 20. As shown in FIGS. 2 to 4, the element package 40 includes a semiconductor element 41, a rewiring layer 42, and a sealing resin body 45.

The semiconductor element 41 has a switching element formed on a semiconductor substrate 410 made of silicon (Si), a wide bandgap semiconductor having a wider bandgap than silicon, or the like. Examples of a wide bandgap semiconductor include silicon carbide (SiC), gallium nitride (GaN), gallium oxide (Ga2O3), and diamond. The semiconductor element 41 may also be referred to as a power element or a semiconductor chip.

The semiconductor element 41 of the present embodiment is an above-mentioned n-channel type MOSFET 11 formed on the semiconductor substrate 410 made of SiC as a composing material. The MOSFET 11 has a vertical structure so that a main electric current flows in the thickness direction of the semiconductor element 41 (i.e., of semiconductor substrate 410), that is, along the Z direction. The semiconductor element 41 has a main electrode on each of plate surfaces of the semiconductor substrate 410. The semiconductor element 41 has a gate electrode (not shown). The gate electrode has, for example, a trench structure.

As shown in FIG. 5, the semiconductor element 41 has a source electrode 41s formed on front surface 410a of the semiconductor substrate 410 and a drain electrode 41d formed on a back surface 410b opposite to the front surface 410a. When the diode 12 is a parasitic diode, the source electrode 41s also serves as an anode electrode, and the drain electrode 41d also serves as a cathode electrode. The diode 12 may be configured on a chip different from the MOSFET 11. The source electrode 41s corresponds to an electrode or a transistor electrode.

In the present embodiment, as an example, a configuration in which a plating layer 48a and a metal layer 47 are provided on the source electrode 41s is adopted (FIG. 4). However, in FIG. 5, the plating layer 48a and the metal layer 47 are omitted in order to simplify the drawing.

The drain electrode 41d is formed on substantially an entire surface of the back surface 410b of the semiconductor substrate 410. The source electrode 41s is formed on a part of the front surface 410a of the semiconductor substrate 410. On the front surface 410a of the semiconductor substrate 410, a pad 41p, which is an electrode for signals, is formed in a region different from a region where the source electrode 41s is formed. The pad 41p is electrically separated from the source electrode 41s.

As shown in FIG. 5, the pad 41p is formed near an end portion on a side opposite to a formation region of the source electrode 41s in the Y direction. The pad 41p is provided alongside the source electrode 41s in the Y direction. The pad 41p includes at least a pad for a gate electrode. The semiconductor element 41 of the present embodiment has five pads 41p. More specifically, five pads 41p are, respectively, for the gate electrode, for a Kelvin source that detects a potential of the source electrode 41s, for the current sense, for the anode potential of a temperature sensitive diode (i.e., temperature sensitive element) that detects temperature of the semiconductor element 41, and for the cathode potential of the same. The five pads 41p are collectively formed on one end side in the Y direction and are formed side by side along the X direction in the semiconductor element 41 having a substantially rectangular plane shape.

In the present embodiment, as an example, the source electrode 41s made of a material containing aluminum (Al) as a main component is adopted. For the drain electrode 41d and the pad 41p, the same material as the source electrode 41s can be used. However, the present disclosure is not limited to such a configuration.

The rewiring layer 42 is arranged on the front surface 410a of the semiconductor element 41, that is, on the source electrode 41s side. The rewiring layer 42 is contacts the front surface 410a of the semiconductor element 41. The rewiring layer 42 has a mounting surface 42a, which is a surface on a semiconductor element 41 side (i.e., a surface facing the element 41), and a back surface 42b, which is a surface opposite to the mounting surface 42a in the Z direction. The semiconductor element 41 is arranged on the mounting surface 42a of the rewiring layer 42 (as shown in FIG. 3).

The rewiring layer 42 has an insulator 43 and a wiring 44 provided on the insulator 43. The insulator 43 is formed by a material containing a resin such as polyimide or the like. The wiring 44 is formed by using a metal having good conductivity such as Cu or the like. The wiring 44 includes a source wiring 44s electrically connected to the source electrode 41s and a signal wiring 44p electrically connected to the pad 41p. The source wiring 44s is connected to the source electrode 41s, and the solder 80 is connected to the source wiring 44s. The source wiring 44s corresponds to a wiring and a main wiring portion.

A part of each of the source wiring 44s and the signal wiring 44p is exposed from the insulator 43 on a back surface 42b side of the rewiring layer 42. The exposed portion of the signal wiring 44p from the insulator 43 forms a terminal portion 440p for external connection. The rewiring layer 42 of the present embodiment has five signal wirings 44p corresponding to the pads 41p. That is, there are five, separate terminal portions 440p that are independent of each other.

The sealing resin body 45 seals at least a part of the mounting surface 42a of the rewiring layer 42 and the semiconductor element 41. The sealing resin body 45 is formed of, for example, an epoxy resin. The epoxy resin contains a filler (not shown) such as silica. The sealing resin body 45 is molded by, for example, a compression molding method. The sealing resin body 45 is a primary molded body that seals the semiconductor element 41, and the sealing resin body 30 is a secondary molded body that seals the element package 40.

The sealing resin body 45 has one surface 45a and a back surface 45b which is opposite to the one surface 45a in the Z direction (as shown in FIG. 3). The one surface 45a is a surface on a one surface side of (i.e., facing) the semiconductor substrate 410. The sealing resin body 45 serves as a mold element together with the semiconductor element 41. The rewiring layer 42 is arranged on the mold element, that is, over the semiconductor element 41 and the sealing resin body 45.

The drain electrode 41d of the present embodiment is covered with a conductive electrode protection member 46. That is, the electrode protection member 46 is exposed from the back surface 45b. The drain electrode 41d of the semiconductor element 41 may be exposed from the back surface 45b. That is, the element package 40 may be configured not to include the electrode protection member 46. Details of the element package 40 are described later.

The heat radiating members 50 and 60 radiate heat generated by the semiconductor element 41 to the outside on both sides of the semiconductor device 20 in the Z direction. The heat radiating members 50 and 60 may be referred to as heat sinks. The heat radiating members 50 and 60 are arranged so as to sandwich a part of the element package 40 including the semiconductor element 41. The heat radiating members 50 and 60 are arranged so as to face each other in the Z direction (as shown in FIG. 3). The heat radiating members 50 and 60 include the semiconductor element 41 and the source wiring 44s in a plan view (as shown in FIG. 3). The heat radiating members 50 and 60 include a part of the signal wiring 44p in a plan view (as shown in FIG. 3). In the present embodiment, the signal wiring 44p is drawn (i.e., extends) from the pad 41p to an outer region that does not overlap with the heat radiating members 50 and 60 in a plan view. The terminal portion 440p is located outside the heat radiating members 50 and 60 in a plan view. Instead of such a configuration, the terminal portion 440p may be arranged in an overlap region overlapping the heat radiating members 50 and 60 in a plan view.

As the heat radiating members 50 and 60, for example, a metal plate made of copper (Cu), Cu alloy, or the like, a metal ceramic substrate such as a DBC substrate or an AMB substrate, or a metal resin substrate in which a metal and a resin having high thermal conductivity are laminated/layered just like the metal ceramic substrate can be adopted. The metal plate may sometimes be referred to as a lead frame. DBC is an abbreviation of Direct Bonded Copper. AMB is an abbreviation of Active Metal Brazing. The heat radiating members 50 and 60 may be provided with a plating film such as nickel (Ni) or gold (Au) on a metal surface.

The heat radiating members 50 and 60 of the present embodiment are AMB substrates. The heat radiating member 50 includes an insulating base member 51 and metal bodies 52 and 53. The insulating base member 51 is made of nitride ceramic. The metal bodies 52 and 53 are provided as a Cu plate or a Cu foil. The metal bodies 52 and 53 are connected to the insulating base member 51 by a brazing material containing an active metal such as titanium (Ti).

The metal body 52 is provided on a surface of the insulating base member 51 facing the element package 40. The metal body 53 is provided on a surface of the insulating base member 51 opposite to the metal body 52. The metal body 52 is connected to the source wiring 44s via the solder 80. More specifically, in the present embodiment (as shown in FIG. 4), as an example, a configuration in which the plating layer 48b is provided on the source electrode 41s is adopted. Therefore, the metal body 52 is connected to the source wiring 44s via the plating layer 48b. The plating layer 48b is made of the same material as the plating layer 48a. However, the present disclosure can be adopted even in a configuration in which the plating layer 48b is not provided. The solder 80 corresponds to a connecting member.

The metal body 52 functions as wiring for the source electrode 41s. Therefore, the heat radiating member 50 may also be referred to as a wiring member. The metal body 53 is electrically separated from the metal body 52 by the insulating base member 51. The heat generated by the semiconductor element 41 is transferred to the metal body 53 via the solder 80, the metal body 52, and the insulating base member 51. The metal body 53 provides a heat dissipation function.

Here, the connection portion of the solder 80 is described in detail with reference to FIG. 4. FIG. 4 is an enlarged view of a region IV indicated by a one-dot chain line in FIG. 3. As shown in FIG. 4, the solder 80 has a fillet formed in a state of being connected to the plating layer 48b and the metal body 52. In other words, the solder 80 has a shape in which a cross-sectional area becomes wider as it goes from the source electrode 41s side to the metal body 52. Note that the cross-sectional area here is an area along the XY plane. An angle of the fillet (i.e., a fillet angle α) is preferably 135 degree or more. As a result, the semiconductor device 20 can increase the connection area (i.e., an area size of the connection) between the solder 80 and the metal body 52. Therefore, the semiconductor device 20 can improve the heat dissipation via the solder 80 as well as reliability of connection using the solder 80. Note that, in FIG. 3, the shape of the solder 80 is simplified for illustration purposes.

The heat radiating member 50 has a substantially rectangular plane shape. The heat radiating member 50 has a facing surface 50a which is a surface facing the element package 40 and a back surface 50b which is a surface opposite to the facing surface 50a (i.e., facing away from the element package 40). In the metal body 52, a surface opposite to the insulating base member 51 forms the facing surface 50a, and in the metal body 53, a surface opposite to the insulating base member 51 forms the back surface 50b. In the present embodiment, the back surface 50b of the heat radiating member 50 is exposed from the front surface 30b of the sealing resin body 30. The back surface 50b may also be referred to as a heat radiating surface or an exposed surface. The front surface 30b is a surface on a same side as the one surface of the semiconductor element 41 in the Z direction, that is, a surface on a source electrode 41s side (and facing down in FIG. 3). The front surface 30b is, for example, a flat surface. The back surface 50b is substantially flush with the front surface 30b of the sealing resin body 30.

The heat radiating member 60 has the same configuration as the heat radiating member 50. The heat radiating member 60 includes an insulating base member 61 and metal bodies 62 and 63. The metal body 62 is provided on a surface of the insulating base member 61 facing the element package 40. The metal body 62 is connected to the electrode protection member 46 via a solder 81. The metal body 62 functions as wiring for the drain electrode 41d. Therefore, the heat radiating member 60 may also be referred to as a wiring member. The metal body 63 is provided on a surface of the insulating base member 61 opposite to the metal body 62. The metal body 63 is electrically separated from the metal body 62 by the insulating base member 61. The heat generated by the semiconductor element 41 is transferred to the metal body 63 via the solder 81, the metal body 62, and the insulating base member 61. The metal body 63 provides a heat dissipation function.

The heat radiating member 60 has a substantially rectangular plane shape. The heat radiating member 60 has a facing surface 60a which is a surface facing the element package 40 and a back surface 60b which is a surface opposite to the facing surface 60a. In the metal body 62, a surface opposite to the insulating base member 61 forms the facing surface 60a, and in the metal body 63, a surface opposite to the insulating base member 61 forms the back surface 60b. In the present embodiment, the back surface 60b of the heat radiating member 60 is exposed from the back surface 30b of the sealing resin body 30. The back surface 60b may also be referred to as a heat radiating surface or an exposed surface. The back surface 30b is a surface on a same side as the back surface of the semiconductor element 41, that is, a surface on a drain electrode 41d side. The back surface 30b is a surface opposite to the front surface 30b in the Z direction. The back surface 30b is, for example, a flat surface. The back surface 60b is substantially flush with the back surface 30b of the sealing resin body 30.

The main terminals 70 and 71 and the signal terminals 72 are external connection terminals for electrically connecting the semiconductor device 20 to an external device. The main terminals 70 and 71 are electrically connected to the main electrodes. The main terminal 70 is electrically connected to the source electrode 41s. The main terminal 70 may be referred to as a source terminal. The main terminal 71 is electrically connected to the drain electrode 41d. The main terminal 71 may be referred to as a drain terminal.

The main terminal 70 is connected to the source electrode 41s via the heat radiating member 50. The main terminal 70 is connected to one end of the metal body 52 of the heat radiating member 50 in the Y direction. The thickness of the main terminal 70 is thinner than, for example, the metal body 52. The main terminals 70 may be integrally provided with the heat radiating member 50 (i.e., the metal body 52) as a matter of connection, or may be provided as a separate member from the heat radiating member 50 and connected thereto by using connecting member. The main terminal 70 extends from the heat radiating member 50 in the Y direction and projects outward from the side surface 30c of the sealing resin body 30. The main terminal 70 has a bent portion in the middle of a portion covered by the sealing resin body 30, and projects substantially from a vicinity of the center in the Z direction on the side surface 30c.

The main terminal 71 is connected to the drain electrode 41d via the heat radiating member 60. The main terminal 71 is connected to one end of the metal body 62 of the heat radiating member 60 in the Y direction. The thickness of the main terminal 71 is thinner than, for example, the metal body 62. The main terminal 71 may be provided integrally with the heat radiating member 60 (i.e., the metal body 62) as a matter of connection to the heat radiating member 60, or may be provided as a separate member therefrom and may be connected thereto by using a connection member. The main terminal 71 extends from the heat radiating member 60 in the Y direction, and projects outward from the same side surface 30c as the main terminal 70. The main terminal 71 also has a bent portion in the middle of a portion covered by the sealing resin body 30, and projects substantially from a vicinity of the center in the Z direction on the side surface 30c. The two main terminals 70 and 71 are arranged side by side along the X direction.

The signal terminal 72 is electrically connected to the pad 41p of the semiconductor element 41. The signal terminal 72 of the present embodiment is connected to the terminal portion 440p of the rewiring layer 42 via a solder 82. That is, the signal terminal 72 is electrically connected to the pad 41p via the solder 82 and the signal wiring 44p including the terminal portion 440p. The signal terminal 72 extends in the Y direction and projects outward from the side surface 30d of the sealing resin body 30. The semiconductor device 20 of the present embodiment includes five signal terminals 72 corresponding to the pads 41p. The signal terminal 72 is connected to the corresponding pad 41p via the signal wiring 44p. The solders 80, 81, and 82 are multi-element lead-free solders containing Cu, Ni, and the like in addition to Sn, for example. Note that, instead of the solders 80, 81, and 82, a conductive connecting member other than the solder, such as sintered silver, may be used.

As described above, in the semiconductor device 20, the semiconductor element 41 composing one arm is sealed by the sealing resin body 30. The sealing resin body 30 integrates, i.e., integrally seals, an element package 40 including the semiconductor element 41, a part of the heat radiating member 50, a part of the heat radiating member 60, a part of each of the main terminals 70 and 71, and a part of each of the signal terminals 72.

In the Z direction, the semiconductor element 41 is arranged at a position between the heat radiating members 50 and 60. The semiconductor element 41 is sandwiched between the heat radiating members 50 and 60 arranged to face each other. As a result, heat of the semiconductor element 41 can be dissipated to both sides in the Z direction. The semiconductor device 20 has a double-sided heat dissipation structure. The back surface 50b of the heat radiating member 50 is substantially flush with the one surface 30a of the sealing resin body 30. The back surface 60b of the heat radiating member 60 is substantially flush with the back surface 30b of the sealing resin body 30. Since the back surfaces 50b and 60b are exposed surfaces, heat dissipation can be improved.

In the semiconductor device 20, the semiconductor element 41 is packaged together with the rewiring layer 42. The rewiring layer 42 has the signal wiring 44p that electrically relays the pad 41p of the semiconductor element 41 and the signal terminal 72. The signal terminal 72 is solder-connected to the terminal portion 440p of the signal wiring 44p. Therefore, a bonding wire can be eliminated. Further, a terminal (e.g., metal block body) conventionally used in order to secure the height of the bonding wire at a position between the semiconductor element 41 and the heat radiating member 50 is more easily dissipated. Therefore, the physique/volume in the Z direction can be reduced. In addition, the structure and manufacturing process can be simplified.

<Element Package>

Figure 6:
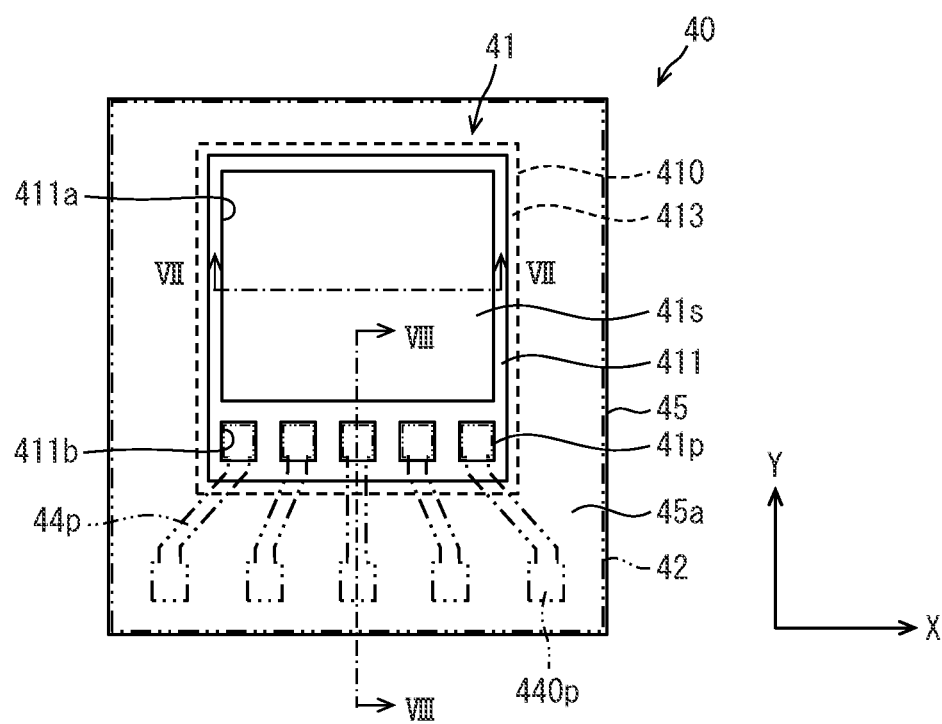
FIG. 6 is a plan view showing an element package.
Figure 8:
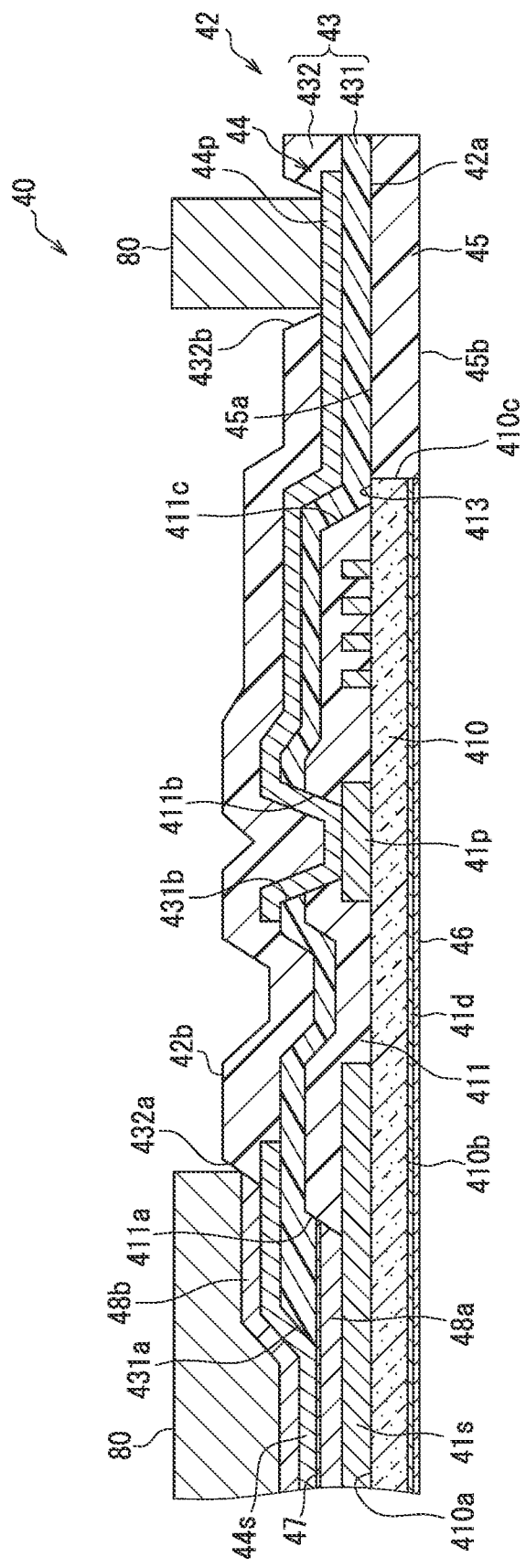
FIG. 8 is a cross-sectional view taken along a VIII-VIII line of FIG. 6.
Figure 9:
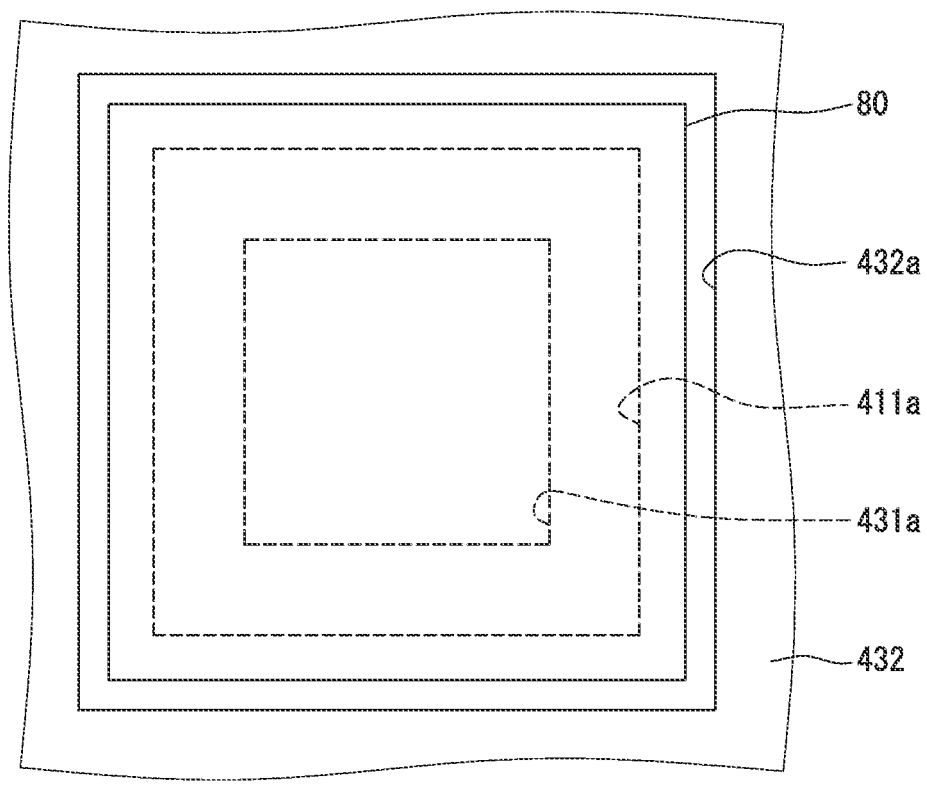
FIG. 9 is a partial plan view showing the element package.

Next, the structure of the element package 40 is described in detail with reference to FIGS. 5, 6, 7, 8, and 9. In FIG. 6, for convenience, the rewiring layer 42 is shown by a two-dot chain line. FIG. 9 is a partial plan view of the element package 40. In FIG. 9, in order to compare the opening areas of the openings 411a, 431a, and 432a, the configurations other than the openings 411a, 431a, and 432a are simplified.

As shown in FIGS. 5 to 8, the semiconductor element 41 has a protective film 411 in addition to the semiconductor substrate 410, the source electrode 41s, the drain electrode 41d, and the pad 41p. The protective film 411 is an electrically insulating film provided on the front surface 410a of the semiconductor substrate 410 so as to cover a peripheral edge of the electrode. The protective film 411 is not provided on the back surface 410b of the semiconductor substrate 410. The protective film 411 may sometimes be referred to as an element insulating film.

The protective film 411 has an opening 411a formed at a position overlapping (and exposing) the source electrode 41s in a plan view (as shown in FIG. 6). The protective film 411 has an opening 411b formed at a position overlapping (and exposing) the pad 41p in a plan view. The opening 411b is provided for each pad 41*p*. The source electrode 41*s* and the pad 41*p* are exposed to the outside through the corresponding openings 411*a* and 411*b*.

The openings 411*a* and 411*b* are all through holes that penetrate the protective film 411 in the Z direction. The protective film 411 covers the peripheral edge of the source electrode 41*s* and the peripheral edge of the pad 41*p*. In other words, the protective film 411 has, for example, an opening 411*a* with which a part of the source electrode 41*s* is exposed. Further, an end portion of the opening 411*a* is (overlappingly) provided on the source electrode 41*s*. Therefore, a connection end portion between the source electrode 41*s* and the protective film 411 is formed in an annular shape. The opening 411*a* corresponds to a first opening. The protective film 411 of the present embodiment is made of polyimide.

As shown in FIG. 5, the semiconductor substrate 410 has an element region 412 and a scribe region 413. The element region 412 includes an active region, which is an element forming region, and an outer peripheral pressure resistant region. The active region may sometimes be referred to as a main region. In the active region, a portion on one surface of the MOSFET 11, that is for example, a trench gate, a base region, a source region, and the like are formed. The outer peripheral pressure resistant region is a region outside the element region 412 and surrounds the element region 412 in a plan view. In the outer peripheral pressure resistant region, a pressure resistant structure such as a guard ring is formed on a surface layer on the front surface 410*a* of the semiconductor substrate 410. The source electrode 41*s* and the pad 41*p* are formed on the element region 412.

The scribe region 413 is a region within a predetermined range from an outer peripheral edge of the semiconductor substrate 410 in a plan view. The scribe region 413 surrounds the element region 412 in a plan view. The scribe region 413 is a dicing region when the semiconductor substrate is chipped (i.e., is cut out into pieces) from a wafer state. By dicing a wafer-shaped semiconductor substrate along the scribe region 413, a chip-shaped semiconductor substrate 410 can be obtained. The protective film 411 of the present embodiment is arranged only on the element region 412. The protective film 411 is not arranged on the scribe region 413.

The rewiring layer 42 is arranged so as to overlap a mold element, that is, the semiconductor element 41 and the sealing resin body 45 in a plan view. The insulator 43 of the rewiring layer 42 is provided so as to cover a part of the source wiring 44*s* and the signal wiring 44*p*. The insulator 43 is composed of insulating films 431 and 432 arranged in multiple layers. The insulating film 431 is laminated on the front surface 410*a* of the semiconductor element 41 and on the one surface 45*a* of the sealing resin body 45. The insulating film 432 is laminated on the insulating film 431. The insulating films 431 and 432 of the present embodiment are formed by using the same material as the protective film 411, specifically using polyimide.

The first layer insulating film 431 has openings 431*a* and 431*b*. See FIGS. 7 and 8. The opening 431*a* is formed at a position overlapping the source electrode 41*s* in a plan view. The opening 431*a* overlaps at least a part of the opening 411*a* in a plan view. The opening 431*b* is formed at a position overlapping the pad 41*p* in a plan view. The opening 431*b* overlaps at least a part of the opening 411*b* in a plan view. The opening 431*b* is provided for each pad 41*p*.

In other words, the insulating film 431 has the opening 431*a* so that a part of the source wiring 44*s* is exposed. The end portion of the opening 431*a* is provided in a facing region of the opening 411*a*. As is described later, the plating layer 48*b* and the metal layer 47 are provided on the source wiring 44*s*. Therefore, the insulating film 431 has the opening 431*a* so that the metal layer 47 is exposed as a part of the source wiring 44*s*. The insulating film 431 corresponds to a first insulator. The opening 431*a* corresponds to a second opening.

Note that, in a configuration in which the metal layer 47 is not provided, the plating layer 48*b* is exposed from the opening 431*a*. Further, in a configuration in which the metal layer 47 and the plating layer 48*b* are not provided, the source wiring 44*s* itself is exposed from the opening 431*a*.

The insulating film 432 on/as a second layer (i.e., on top of the insulating film 431) has openings 432*a* and 432*b*. The opening 432*a* is formed at a position overlapping the source electrode 41*s* in a plan view. The opening 432*b* is formed at a position overlapping the terminal portion 440*p* of the signal wiring 44*p*.

In other words, the insulating film 432 has an opening 432*a* so that a part of the source wiring 44*s* is exposed. An end portion of the opening 432*a* is provided outside the facing region of the opening 411*a*. The solder 80 is provided in the opening 432*a*. The source wiring 44*s* is provided with the plating layer 48*b* at a portion exposed from the opening 432*a*. The insulating film 432 corresponds to a second insulator. The opening 432*a* corresponds to a third opening.

As shown in FIGS. 7 and 9, the opening area of the opening 431*a* is smaller than the opening area of the opening 411*a*. Further, the opening area of the opening 432*a* is larger than the opening area of the opening 411*a*. In other words, the opening 431*a* is formed inside a region surrounded by the opening 411*a* in a plan view. Further, the opening 432*a* is formed outside a region surrounded by the opening 411*a* in a plan view. The first opening 411*a* is characterized by a first dimension D1. The second opening 431*a* is characterized by a second dimension D2. The third opening 432*a* is characterized by a third dimension D3.

Therefore, a connection end portion between the source electrode 41*s* and the protective film 411 is covered with the insulating film 432. Therefore, it can be said that the insulating film 431 is arranged on the connection end portion between the source electrode 41*s* and the protective film 411 in the Z direction. On the other hand, the connecting end portion between the metal layer 47 and the insulating film 431 is not covered with the insulating film 432.

Note that the opening area is an area (i.e., size of an area) along the XY plane in each of the openings 411*a*, 431*a*, and 432*a*. The opening area of the opening 432*a* may be the same as the opening area of the opening 411*a*.

The wiring 44 can be formed by, for example, a plating method, a dispensing method, or a printing method. The wiring 44 of the present embodiment is formed by a plating method. As shown in FIG. 8 and the like, the source wiring 44*s* is formed directly above the source electrode 41*s*. The source wiring 44*s* is laminated on at least the exposed portion of the source electrode 41*s*. The source wiring 44*s* includes a wiring arranged as a first layer on the insulating film 431 so as to cover the exposed portion of the source electrode 41*s* in the opening 431*a*. The peripheral edge of the wiring as the first layer is covered with the insulating film 432. The plating layer 48*b* can be said as a wiring on a second layer of the source wiring 44*s*. The second layer wiring is laminated on the first layer wiring in the opening 432*a*.

Further, in the present embodiment, the source wiring 44*s* electrically connected to the source electrode 41*s* via the metal layer 47 and the plating layer 48*a* is adopted. More specifically, the plating layer 48a, the metal layer 47, and the source wiring 44s are laminated in this written order on the source electrode 41s (as shown on a left side of FIG. 8). The plating layer 48a is a plating film of a metal containing, for example, Ni as a main component, which improves connectivity with solder. For the metal layer 47, a material containing a metal such as Au as a main component can be used. Therefore, the plating layer 48a and the metal layer 47 can both be regarded as a part of the source wiring 44s of the rewiring layer 42. In other words, the semiconductor device 20 includes wiring for the main electrode including the source wiring 44s, the plating layer 48a, and the metal layer 47. The wiring for the main electrode is a wiring electrically connected to the source electrode 41s. However, the present disclosure is not limited to such a configuration. The source wiring 44s may have a configuration not including the plating layer 48a or the metal layer 47. Note that the plating layer 48b can also be regarded as a part of the source wiring 44s.

As shown in FIG. 8, the signal wiring 44p is laminated on the exposed portion of the pad 41p. The signal wiring 44p includes a first layer wiring arranged on the insulating film 431 so as to cover the exposed portion of the pad 41p in the opening 431b. A part of the first layer wiring is exposed by the opening 432b, and the other part is covered by the insulating film 432. The exposed portion of the first layer wiring forms the terminal portion 440p of the signal wiring 44p. The first layer wiring extends from the corresponding pad 41p to the terminal portion 440p so as to straddle/across a boundary between the element region 412 and the scribe region 413 in the Y direction.

The signal wiring 44p may include a second layer wiring just like the source wiring 44s. The second layer wiring is laminated on the first layer wiring in the opening 432b. The second layer wiring serves as the terminal portion 440p together with the first layer wiring. For the signal wiring 44p, the same material as the source wiring 44s can be used. For the second layer wiring of the signal wiring 44p, the same material as the second layer wiring of the source wiring 44s can be used.

The sealing resin body 45 seals the semiconductor element 41 as described above. As shown in FIG. 8, the sealing resin body 45 covers the side surface 410c of the semiconductor substrate 410. The sealing resin body 45 is in contact with (in adhesion to) the side surface 410c. The side surface 410c is a surface substantially parallel to the Z direction connecting the front surface 410a and the back surface 410b. The sealing resin body 45 of the present embodiment covers the entire surface of the side surface 410c. Further, the sealing resin body 45 seals the semiconductor element 41 so that the source electrode 41s is exposed. Further, the sealing resin body 45 seals the semiconductor element 41 so that the drain electrode 41d and the pad 41p are exposed.

<Effects>

As described above, since the opening 431a of the semiconductor device 20 has a smaller opening area than the opening 411a, the first insulator covers the position where the end portion of the opening 411a and the source electrode 41s overlap. That is, in the Z direction, the insulating film 431 is arranged on the connection end portion between the source electrode 41s and the protective film 411. Further, the semiconductor device 20 is located, in a plan view, at a position away from (i) the connection end portion of the source wiring 44s with the insulating film 431 and (ii) the connection end portion of the source electrode 41s with the protective film 411. Therefore, the semiconductor device 20 can suppress an application of stress to the position of the source electrode 41s that overlaps with the end portion of the opening 411a. In such manner, the semiconductor device 20 can suppress cracks caused in the source electrode 41s, and can ensure/guarantee the reliability of the source electrode 41s.

Further, in the semiconductor device 20, the opening 432a in which the solder 80 is arranged is equal to or larger than the opening area of the opening 411a. Therefore, even if the semiconductor device 20 has a configuration in which the opening area of the 431a is smaller than that of the opening 411a, it is possible to prevent the connection area between the source wiring 44s and the solder 80 from becoming small. Therefore, the semiconductor device 20 can suppress a decrease in heat dissipation.

Although the semiconductor device 20 can suppress stress as described above, stress may also be applied to the connection end portion of the source electrode 41s with the protective film 411. Further, in the semiconductor device 20, stress is also applied to the connection end portion of the source wiring 44s with the insulating film 431 due to thermal stress of the solder 80. Further, in the semiconductor device 20, stress is more likely to be applied to the connection end portion of the source wiring 44s with the insulating film 431 than to the connection end portion of the source electrode 41s with the protective film 411.

Therefore, in the present embodiment, it may be preferable to provide the plating layer 48a containing nickel as a main component on the source electrode 41a containing aluminum as a main component. In general/principle, nickel is stronger than aluminum. Strength is strength of component material, which may be elasticity rate and/or hardness. Therefore, the semiconductor device 20 can easily/readily secure the reliability of the source electrode 41a by making it having a relatively high strength.

Note that the connection end portion of the source wiring 44s with the insulating film 431 is located at a portion surrounded by a frame (i.e., a circle) A in FIG. 4. The connection end portion of the source wiring 44s with the insulating film 431 is located at a position overlapping the end portion of the opening 431a of the source wiring 44s.

A preferred embodiment of the present disclosure has been described above. However, the present disclosure is not limited to the above embodiment, and various modifications are possible without departing from the spirit of the present disclosure. Hereinafter, first to third modifications are described as other forms of the present disclosure. The above-described embodiments and first to third modifications can be carried out individually, but can also be carried out in combination as appropriate. The present disclosure is not limited to the combinations described in the embodiments, and may be implemented in various combinations.

(First Modification)

Figure 10:
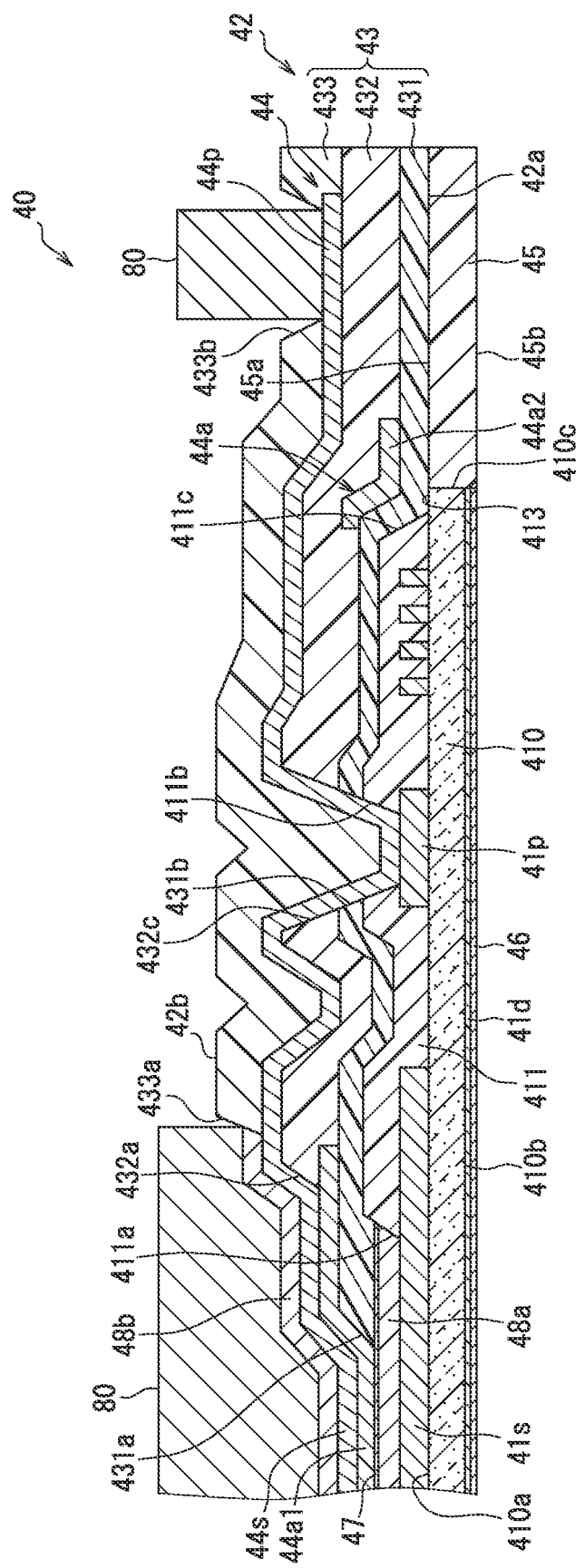
FIG. 10 is a partial cross-sectional view showing the element package according to a first modification.

The semiconductor device 20 of the first modification is described with reference to FIG. 10. The semiconductor device 20 is different from the above embodiment in that the wiring is laminated/layered. The semiconductor device 20 includes a first wiring 44a and an insulating film 433 in addition to the configuration of the above embodiment.

The first wiring 44a is made of the same material as the source wiring 44s. The first wiring 44a has a connecting portion 44a1 and a separating portion 44a2. The connecting portion 44a1 is electrically connected to the metal layer 47 and the source wiring 44s. A part of the connecting portion 44a1 is directly connected to the metal layer 47 and the source wiring 44s. Also, other part of the connecting portion 44a1 is laminated with or on the metal layer 47 via the insulating film 431. Further, yet other part of the connecting portion 44a1 is laminated with or on the source wiring 44s via the insulating film 432.

Therefore, the connecting portion 44a1 can be regarded as a part of the source wiring 44s of the rewiring layer 42. In other words, the semiconductor device 20 includes wiring for the main electrode including the source wiring 44s, the plating layer 48a, the metal layer 47, and the connecting portion 44a1. The connecting portion 44a1 corresponds to wiring. Note that, in the first modification, the source wiring 44s electrically connected to the pad 41p is adopted as an example.

The separating portion 44a2 is electrically separated from the source electrode 41s. That is, the separating portion 44a2 is electrically separated from the connecting portion 44a1. It can also be said that the separating portion 44a2 is a portion electrically independent of the source electrode 941s. However, since the separating portion 44a2 is manufactured in the same process as the connecting portion 44a1 or is arranged in the same layer, it can be regarded as a part of the first wiring 44a. As described above, in the semiconductor device 20, the separating portion 44a2 is included in the first wiring 44a. Therefore, the first wiring 44a can be said to be a dummy wiring.

The separating portion 44a2 is provided at a position between the insulating films 431 and 432. The separating portion 44a2 is provided at a position between (i) the boundary between the semiconductor substrate 410 and the sealing resin body 45 and (ii) the source wiring 44s. In the semiconductor device 20, the boundary between the semiconductor substrate 410 and the sealing resin body 45, the separating portion 44a2, and the source wiring 44s are laminated and arranged in this written order along the Z direction. The source wiring 44s corresponds to a portion electrically connected to the source electrode 41s in the wiring of or on a plurality of layers.

The insulator 43 is composed of the insulating films 431, 432 and 433 arranged in multiple layers. The insulating film 433 is made of the same material as the other insulating films 431 and 432. The insulating film 433 is provided so as to be laminated on a part of the source wiring 44s. The insulating film 432 is provided with an opening 432c in a facing region of the pad 41p. A part of the wiring 44 is arranged in the opening 432c.

The insulating film 433 has openings 433a and 433b. The opening 433a is formed at a position overlapping the source electrode 41s in a plan view. The opening 433a overlaps at least a part of the opening 411a in a plan view. The opening 433b is formed at a position deviated from the pad 41p in a plan view. In the present modification, the insulating film 433 corresponds to a second insulator, and the opening 433a corresponds to a third opening. Therefore, the opening area of the opening 433a is larger in size than the opening area of the opening 411a.

The semiconductor device 20 of the first modification can exhibit the same effects as those of the above embodiment. In the semiconductor device 20, the source wiring 44s and the connecting portion 44a1 are laminated. Therefore, the semiconductor device 20 can improve the degree of freedom in routing the wiring connected to the source electrode 41s.

In the semiconductor device 20, the boundary between the semiconductor substrate 410 and the sealing resin body 45 may be peeled off/separated due to thermal stress. When the semiconductor device 20 has such peel off, the insulating film 431 may be cracked. Therefore, the semiconductor device 20 includes the separating portion 44a2. Therefore, the semiconductor device 20 can prevent cracks from reaching the source wiring 44s. Therefore, the semiconductor device 20 can secure the electrical insulation reliability of the source wiring 44s.

(Second Modification)

Figure 11:
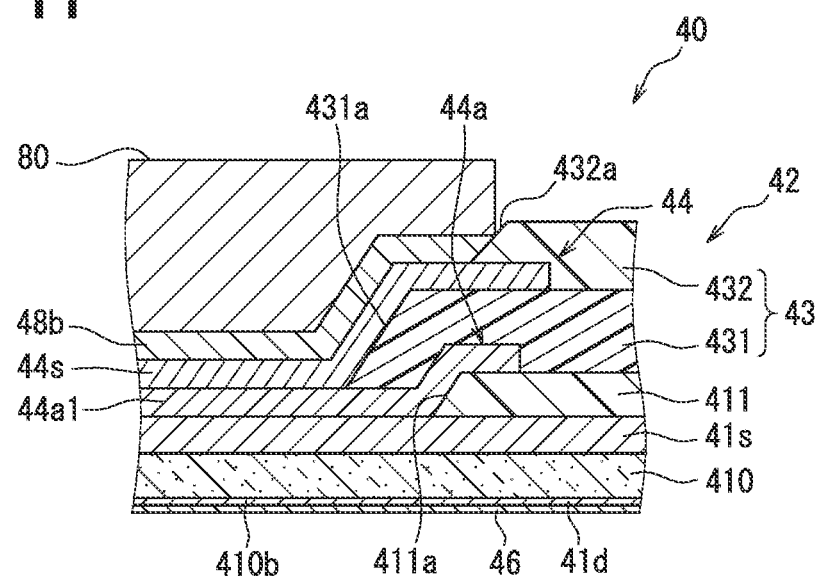
FIG. 11 is a partial cross-sectional view showing an element package according to a second modification.

As shown in the second modification of FIG. 11, the semiconductor device 20 does not have to be provided with the plating layer 48a on the source electrode 41s. In the semiconductor device 20, the connecting portion 44a1 is directly connected to the source electrode 41s. In the semiconductor device 20, it can be said that the wiring for the main electrode is directly connected to the source electrode 41s. Further, in the semiconductor device 20, a part of the first wiring 44a is arranged at a position between the protective film 411 and the insulating film 431. The semiconductor device 20 of the second modification can exhibit the same effects as those of the above embodiment.

(Third Modification)

As shown in FIG. 12, the semiconductor device 20 can employ heat radiating members 50 and 60 that do not include the insulating base materials 51 and 61. Even with such a semiconductor device 20, the same effects as those of the above embodiment can be obtained. Note that, in FIG. 12, the sealing resin body 30 is not shown in order to simplify the drawing.

Although the present disclosure has been described in accordance with the embodiment, it is understood that the present disclosure is not limited to such an embodiment or structure. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

What is claimed is:

1. A semiconductor device comprising:
   a semiconductor element including:
      (i) a semiconductor substrate,
      (ii) an electrode formed on a front surface of the semiconductor substrate, and
      (iii) a protective film having a first opening that exposes a part of the electrode, and configured to position an end portion of the first opening on the electrode; and
   a rewiring layer arranged on one side with respect to the semiconductor element, the rewiring layer including:
      (i) a sealing resin body that seals the semiconductor element with the electrode exposed therefrom,
      (ii) wiring that is connected to the electrode and to a conductive connecting member, and
      (iii) an insulator that covers a part of the wiring, wherein
   the insulator includes:
      (i) a first insulator having (a) a second opening for exposing a part of the wiring, and (b) an end portion of the second opening provided in a facing region of the first opening; and
      (ii) a second insulator having (c) (i) a third opening for exposing a part of the wiring and (ii) a connecting member arranged therein, and (d) an end portion of the third opening provided outside the facing region of the first opening, and
   a size of the opening area of the second opening is smaller than a size of the opening area of the first opening, and
   a size of the opening area of the third opening is equal to or larger than a size of the opening area of the first opening.

2. The semiconductor device of claim 1, wherein
a fillet is formed in the connecting member, and the angle of the fillet is 135 degrees or more.

3. The semiconductor device of claim 1, wherein:
the wiring has a main wiring portion, and has a metal layer arranged between the main wiring portion and the electrode,
the first insulator has the second opening so that the metal layer is exposed as a part of the wiring, and
the second insulator has the third opening so that the main wiring portion is exposed as a part of the wiring.

4. The semiconductor device of claim 1, wherein
the wiring is directly connected to the electrode.

5. The semiconductor device of claim 1, wherein
the wiring has a plurality of layers laminated via the insulator.

6. The semiconductor device of claim 5, wherein
the wiring having the plurality of layers has a dummy wiring including a separating portion electrically separated from the electrode, and
the separating portion is provided at a position between (i) a boundary between the semiconductor substrate and the sealing resin body and (ii) a portion electrically connected to the electrode in the wiring having the plurality of layers.

7. A semiconductor device comprising:
a semiconductor substrate;
a transistor electrode located on a top surface of the semiconductor substrate;
a protective film:
  (i) located on a top surface of the transistor electrode,
  (ii) defining a first opening, and
  (iii) wherein the first opening is characterized by a first dimension and exposes a central portion of the top surface of the transistor electrode;
a first plating layer:
  (i) located in the first opening, and
  (ii) located on the central portion of the top surface of the transistor electrode;
a metal layer:
  (i) located in the first opening, and
  (ii) located on a top surface of the first plating layer;
a first insulating film including:
  (i) an interior portion of the first insulating film located on a top surface of the metal layer and defining a second opening, wherein the second opening is characterized by a second dimension and exposes an central exposed portion of the metal layer, and
  (ii) an exterior portion of the first insulating film located on a top surface of the first insulating film;
a wiring including:
  (i) a central wiring portion located on the central exposed portion of the metal layer;
  (ii) a non-central wiring portion located on a top surface of the first insulating film;
a second plating layer including:
  (i) a central second plating layer portion located on a top surface of the central wiring portion, and
  (ii) a non-central second plating portion located on a top surface of the non-central wiring portion;
a second insulating film:
  (i) located partly on a peripheral portion of the top surface of the first insulating film,
  (ii) located partly on peripheral portion of a top surface of the non-central wiring portion,
  (iii) defining a third opening characterized by a third dimension,
  (iv) defining a peripheral edge of the wiring, and
  (v) defining a peripheral edge of the second plating layer; and
solder covering a top surface of the second plating layer.

8. The semiconductor device of claim 7, wherein
the second dimension is less than the first dimension, and
the third dimension is greater than or equal to the first dimension.

* * * * *